United States Patent [19]
O'Neill et al.
[11] Patent Number: 4,875,968
[45] Date of Patent: Oct. 24, 1989

[54] METHOD OF FABRICATING INK JET PRINTHEADS

[75] Inventors: James F. O'Neill, Penfield; Donald J. Drake, Rochester; William G. Hawkins, Webster, all of N.Y.
[73] Assignee: Xerox Corporation, Stamford, Conn.

[21] Appl. No.: 305,046
[22] Filed: Feb. 2, 1989
[51] Int. Cl.[4] ........................ H01L 21/306; B44C 1/22; C03C 15/00; C03C 25/06
[52] U.S. Cl. .................................... 156/633; 156/644; 156/645; 156/647; 156/657; 156/662; 156/659.1; 346/140 R
[58] Field of Search ............... 156/633, 634, 644, 645, 156/647, 651, 653, 656, 657, 656, 659.1, 661.1, 662; 346/1.1, 140 R

[56] References Cited

U.S. PATENT DOCUMENTS

| | | | |
|---|---|---|---|
| RE. 32,572 | 2/1988 | Hawkins et al. | 156/626 |
| 4,638,337 | 1/1987 | Torpey et al. | 346/140 R |
| 4,774,530 | 9/1988 | Hawkins | 346/140 R |
| 4,786,357 | 11/1988 | Campanelli et al. | 156/633 |

*Primary Examiner*—William A. Powell
*Attorney, Agent, or Firm*—Robert A. Chittum

[57] ABSTRACT

An improved method of fabricating a thermal ink jet printhead of the type produced by the mating of an anisotropically etched silicon substrate containing ink flow directing recesses with a substrate having heating elements and addressing electrodes is disclosed. An etch resistant material on one surface of a (100) silicon substrate is patterned to form at least two sets of vias therein having predetermined sizes, shapes, and predetermined spacing therebetween. The predetermined spacing permits selected complete undercutting by an anisotropic etchant within a predetermined etching time period. The patterned silicon substrate is anisotropically etched for the predetermined time period to form at least two sets of separate recesses, each recess being separated from each other by a wall, the surfaces of the walls being {111} crystal planes of the silicon substrate, whereby certain predetermined separately etched recesses are selectively placed into communication with each other by the selective undercutting while the remainder of the undercut walls provide strengthening reinforcement to the printhead, so that larger printheads may be fabricated which are more robust without relinquishing resolution or reducing tolerances.

9 Claims, 5 Drawing Sheets

METHOD OF FABRICATING INK JET PRINTHEADS

BACKGROUND OF THE INVENTION

1. Field of the Invention

This invention relates to ink jet printing devices, and more particularly to larger thermal ink jet printheads which are fabricated by an anisotropic etching technique that utilizes predetermined selective mask undercutting to provide printheads that are robust without sacrificing resolution.

2. Description of the Prior Art

Thermal ink jet printing is a type or drop-on-demand ink jet systems, wherein an ink jet printhead expels ink droplets on demand by the selective application of electrical pulses to thermal energy generators, usually resistors, located one each in capillary-filled, parallel ink channels a predetermined distance upstream from the channel nozzles or orifices. The channel end opposite the nozzles are in communication with a small ink reservoir to which a larger external ink supply is connected.

U.S. Re. 32,572 to Hawkins et al. discloses a thermal ink jet printhead and several fabricating processes therefor. Each printhead is composed of two parts aligned and bonded together. One part is a substantially flat substrate which contains on the surface thereof a linear array of heating elements and addressing electrodes, and the second part is a silicon substrate having at least one recess anisotropically etched therein to serve as an ink supply manifold when the two parts are bonded together. A linear array of parallel grooves are also formed in the second part, so that one end of the grooves communicate with the manifold recess and the other ends are open for use as ink droplet expelling nozzles. Many printheads can be made simultaneously by producing a plurality of sets of heating element arrays with their addressing electrodes on a silicon wafer and by placing alignment marks thereon at predetermined locations. A corresponding plurality of sets of channel grooves and associated manifolds are produced in a second silicon wafer. In one embodiment, alignment openings are etched in the second silicon wafer at predetermined locations. The two wafers are aligned via the alignment openings and alignment marks, then bonded together and diced into many separate printheads.

U.S. Pat. No. 4,638,337 to Torpey et al. discloses an improved thermal ink jet printhead similar to that of Hawkins et al., but has each of its heating elements located in a recess. The recess walls containing the heating elements prevent the lateral movement of the bubbles through the nozzle and therefore the sudden release of vaporized ink to the atmosphere, known as blow-out, which causes ingestion of air and interrupts the printhead operation whenever this event occurs. In this patent a thick film organic structure such as Riston® or Vacrel® is interposed between the heater plate and the channel plate. The purpose of this layer is to have recesses formed therein directly above the heating elements to contain the bubble which is formed over the heating elements, thus enabling an increase in the droplet velocity without the occurrence of vapor blow-out and concomitant air ingestion.

U.S. Pat. No. 4,774,530 to Hawkins discloses the use of patterned thick film insulative layer to provide the flow path between the ink channels and the manifold, thereby eliminating the fabrication steps required to open the channel groove closed ends to the manifold recess, so that the printhead fabrication process is simplified.

U.S. Pat. No. 4,786,357 to Campanelli et al., discloses the use of a patterned thick film insulative layer between mated and bonded substrates. One substrate has a plurality of heating element arrays and addressing electrodes formed on the surface thereof and the other being a silicon wafer having a plurality of etched manifolds, with each manifold having a set of ink channels. The patterned thick film layer provides a clearance space above each set of contact pads of the addressing electrodes to enable the removal of the unwanted silicon material of the wafer by dicing without the need for etched recesses therein. The individual printheads are produced subsequently by dicing the substrate having the heating element arrays.

As disclosed in the above-discussed patents, thermal ink jet printheads are fabricated from two substrates. One substrate contains the heating elements and the other contains ink recesses. When these two substrates are aligned and bonded together, the recesses serve as ink passageways. A plurality of each substrate is formed on separate wafers, so that the wafers may be aligned, mated, and diced into many individual printheads. The wafer for the plurality of sets of recesses is silicon and the recesses are formed by an anisotropic etching process. The anisotropic or orientation dependent etching has been shown to be a high yielding fabrication process for precise, miniature printheads. They are low cost, high resolution, electronically addressable printers with high reliability. Such printheads are usually about a quarter of inch wide and print small swaths of information being translated across a stationary recording medium such as paper. The paper is then stepped the distance of one swath and the printing process continued until the entire page of paper is printed. This is a low speed process.

In efforts to increase the printing speed, larger arrays of nozzles are required. Each ink droplet emitting nozzle requires an ink channel which is in communication with an ink reservoir or manifold. In order to complete the etching from only one side of the wafer, the reservoir is etched through the wafer so that the open bottom may serve as an ink inlet. As the array size increases, so also does the reservoir and thus the ink inlet. As the area of the through etch for the reservoirs increase, the wafer strength diminishes and yield drops because many of the fragile wafers are damaged during subsequent assembly operations.

While the anisotropic etching process has many attributes, one of its drawbacks is that a very restricted set of geometries are available because the {111} etch termination planes form a pyramid with the {100} plane as a base. Therefore, only squares and rectangular shapes can be produced in the {100} surface plane, and perpendicular to the {100} plane, pyramidal pits are formed. The square etch pits can be pointed, or rectangular pits can come to an edge if the etch process is allowed to continue until full {111} plane termination occurs, or the bottom of the pit can remain a {100} plane parallel to the surface, if etching is not complete. Of course, if the square or rectangular vias in the etch resistant mask is large enough relative to its thickness, the square or rectangular etched recess will etch through and be open at the bottom with the recess walls being {111} planes.

For silicon printheads, anisotropic or orientation dependent etching of silicon wafers makes use of the preferred etching of the {100} planes to {111} planes. This etch rate ratio can be greater than 100:1. As discussed above, a silicon wafer is coated with a material that is inert to the anisotropic etch bath, such as, for example, a silicon nitride masking layer in an etch bath of potassium hydroxide (KOH). This coating of etch resistant material, usually silicon nitride, is resist coated, photo-patterned, and plasma etched to define a pattern of vias in the silicon nitride. The wafer is then placed in an etchant, resulting in the recesses which have {111} crystal plane walls. Depending upon the size of the vias and the time in the etchant, V-grooves and through holes are formed. Critical to successful orientation dependent etching is alignment of the via patterns to the {111} plane, since any rotation from it results in enlarged etched recesses, as disclosed in more detail in copending application D/88240 by Hawkins et al., entitled "Large Monolithic Thermal In Jet Printheads", and assigned to the same assignee as this invention. Closely adjacent vias can, therefore, cause the etched recesses to merge destroying the intended design. This invention deals with these orientation dependent etching problems while enabling larger printheads to be fabricated without increase in the fragility of the etched wafers.

SUMMARY OF THE INVENTION

It is an object of the present invention to provide increased dimensional control of the etching process during fabrication of the anisotropically etched channel plate or wafer.

It is another object of the invention to enable the fabrication of larger silicon printhead without loss of resolution, tolerance, or robustness.

It is still another object of the invention to utilize the normal undercutting of the etch resistant mask during the orientation dependent etching process to provide recesses having varying sizes and depths.

In the present invention, an improved method of fabricating a thermal ink jet printhead of the type produced by the mating of an anisotropically etched silicon substrate containing ink flow directing recesses with a substrate having heating elements and addressing electrodes is disclosed. The improvement comprises the steps of patterning an etch resistant material on one surface of a (100) silicon substrate to form at least two sets of vias therein having predetermined sizes, shapes, and predetermined spacing therebetween, said predetermined spacing permitting selected complete undercutting by an anisotropic etchant within a predetermined etching time period, and anisotropically etching the patterned silicon substrate for said predetermined time period to form at least two sets of separate recesses. Each etched recess is separated from each other by a wall, the surfaces of said walls being {111} crystal planes of the silicon substrate, whereby certain predetermined separated etched recesses are selectively placed into communication with each other by the undercutting, while the remainder of the undercut walls provide strengthening reinforcement to the printhead, so that larger printheads may be fabricated which are more robust without relinquishing resolution or reducing tolerances. In one embodiment, predetermined areas of the etch resistant material have a plurality of relatively small vias of predetermined size and spacings therebetween in the form of a grid pattern which enables delayed etching of large areas because of undercutting so that the resulting recesses have either predetermined depths or varying depths.

A more complete understanding of the present invention can be obtained by considering the following detailed description in conjunction with the accompanying drawings, wherein like parts have like index numerals.

DESCRIPTION OF THE PREFERRED EMBODIMENT

Figure 1:
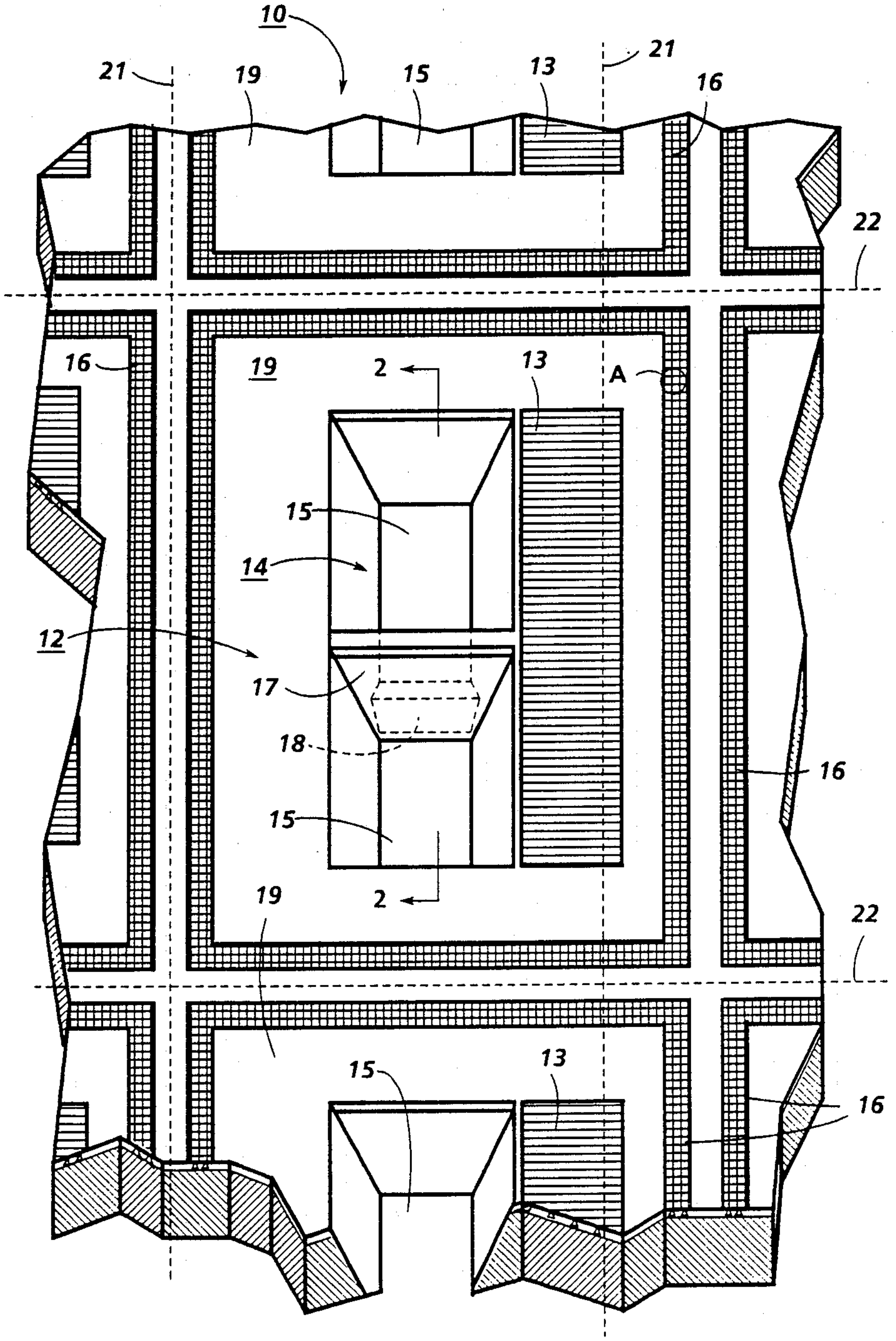
FIG. 1 is a partially shown, enlarged isometric view of an anisotropically etched wafer of the present invention, the wafer being shown prior to the completion of the etching time period.

According to U.S. Pat. No. 4,638,337 to Torpey et al. and U.S. reissue Re. 32,572 to Hawkins et al., thermal ink jet printheads may be mass produced by sectioning of at least two mated planar substrates containing on confronting surfaces thereof respective matched sets of linear arrays of heating elements with addressing electrodes and linear arrays of parallel elongated grooves, each set of grooves being interconnected with a common recess having an opening through the opposite substrate surface. The elongated grooves serve as ink channels, and the common recess serves as an ink reservoir or manifold. The recess opening is the ink inlet to which an ink supply is connected. Each ink channel contains a heating element and the sectioning operation, generally a dicing operation, opens the ends of the ink channels opposite the ends connecting with the manifold, if not already open, and forms the nozzle containing surface. After the sectioning operation, the heating elements are located at a predetermined location upstream from the nozzles. The main difference between the above identified patents is that Torpey et al. contains an intermediate thick film, photo-curable polymer layer sandwiched between the mated substrates. The thick film layer is patterned to expose the heating elements, this effectively places the heating elements in a pit whose vertical walls inhibits vapor bubble growth in the direction parallel to the heating element surface. This prevents vapor blow-out and the resultant ingestion of air which produces a rapid printhead failure mode.

This invention relates to an improved method of fabricating a thermal ink jet printhead, wherein the improvement comprises controlling of the separation distance between vias patterned in the etch resistant mask so that the etched wall produced between the adjacent recesses will have a predetermined thickness which will undercut from both sides of adjacent recesses at some time prior to completion of the etching time period. Generally, the etching time period is that time required for complete etch through of a (100) silicon wafer. At the point of complete undercut, planes other than {111} planes are exposed and will begin etching at a very rapid rate; the etch rate is on the order of that of a {100} plane. With proper selection of the initial wall width, the etch time of the wall destruction can be controlled and, therefore, wall height is controlled. Selection of the initial wall width thus is critical to successful fabrication of the channel plate wafer. Too wide and a wall will not undercut enough for the opposing wall surfaces to meet, while a wall that is too narrow will undercut too soon and the entire wall will be etched away.

When the arrays of ink channels and nozzles are enlarged to increase the width of printed swaths of information and thus increase the printing speed, the reservoir which supplies ink to the channels is also lengthened. The removal of this much silicon throughout the wafer causes a dramatic loss of wafer strength and results in a very fragile channel plate wafer.

Figure 2:
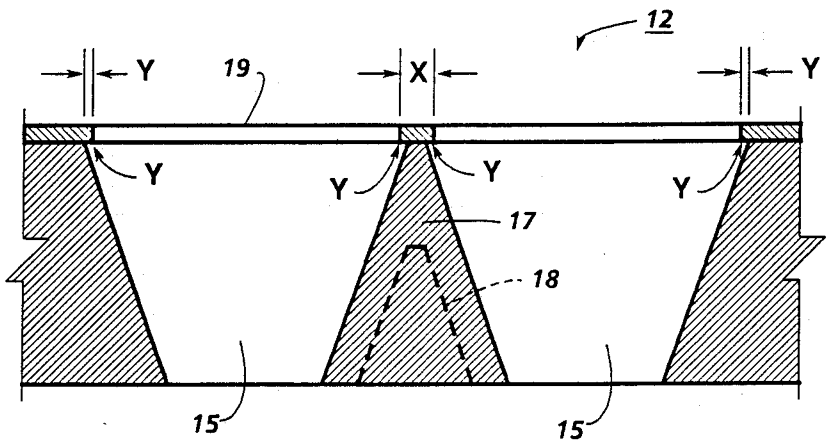
FIG. 2 is a cross sectional view of a portion of the wafer of FIG. 1 as viewed along view line 2—2.

Referring to FIG. 1, a partially shown, isometric view of a patterned and partially anisotropically etched channel plate wafer for large array thermal ink jet printheads is depicted. In a typical large array printhead, about 200 ink channels at 300 channels per inch covering the distance of about 0.66 inches are used. The one full channel plate 12 that is shown has, for example, about 200 ink channel recesses 13 (fewer shown for clarity) and a segmented reservoir 14, having at least two individually etched through holes 15 separated by wall 17. FIG. 2 is an enlarged, cross sectional view of a one of the channel plates 12 of channel plate wafer 10, as viewed along view line 2—2 of FIG. 1. A full through wafer etch results in an undercut "Y" of the etch resistant mask 19 of about seven micrometers. Any distance between separate vias in the etch resistant mask 19 less than 14 micrometers will completely undercut, when etched from both sides, and begin to be etched away or self destruct towards the end of the etching process. With proper selection of the initial wall, width "X" (about two times Y), the etch time of the wall destruction is controlled, so that a remaining wall portion 18, shown in dashed line, is produced which acts as a strengthening rib 18 and concurrently enables communication between the individual through holes 15, so that the combined through holes function as one elongated, segmented reservoir 14. After the etched channel plate wafer 10 is aligned and bonded to a heating element plate wafer (not shown), it is diced along dice lines 21, 22 (see FIG. 1) to form a plurality of individual printheads (not shown). Strengthening ribs 18 increase the robustness of the channel plate wafer even though the reservoir or manifold is much larger and longer to supply ink to the increased number of ink channels.

Figure 4:
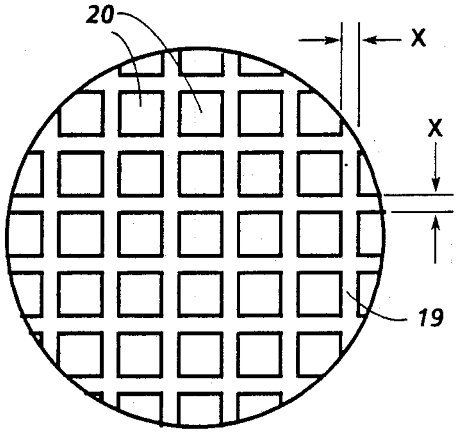
FIG. 4 is an enlarged plan view of the surface portion of FIG. 1 and/or 3 encircled by circle A.

For an optional feature, a plurality of small rectangular vias 20 in predetermined two dimensional patterns or grids 16 may be formed in the etch resistant material 19. These small vias are each spaced from each other by distances "X" equal to or less than twice the etching undercut distance "Y". The distance "X" is equal to or less than 14 micrometers, and the small rectangular vias may range from 5 to 500 micrometers on a side. FIG. 4 is an enlarged plan view of that portion of the two dimensional patterns or grids 16 of vias encircled by circle "A" in FIG. 1. Since the spacing is less than the undercutting from opposite sides of the etched wall between adjacent vias 20, the wall will start to be etched away near the end of the anisotropic etching time period. Thus, various shapes of recesses can be formed by utilizing the masks' undercutting. In FIG. 1, this additional recess 27 (see FIG. 5) is designed to provide clearance for the addressing electrode terminals. This is an alternative approach to providing electrode terminal clearance that is disclosed in U.S. Pat. Re. No. 32,572 to Hawkins et al. and U.S. Pat. No. 4,786,357 to Campanelli et al. Since FIG. 1 is shown prior to completion of the etching time period, the undercutting between vias 20 in the grid pattern 16 is not completed. For the completion of the etching, refer to FIG. 5 for a cross-sectional view of the finished recesses 27.

Figure 3:
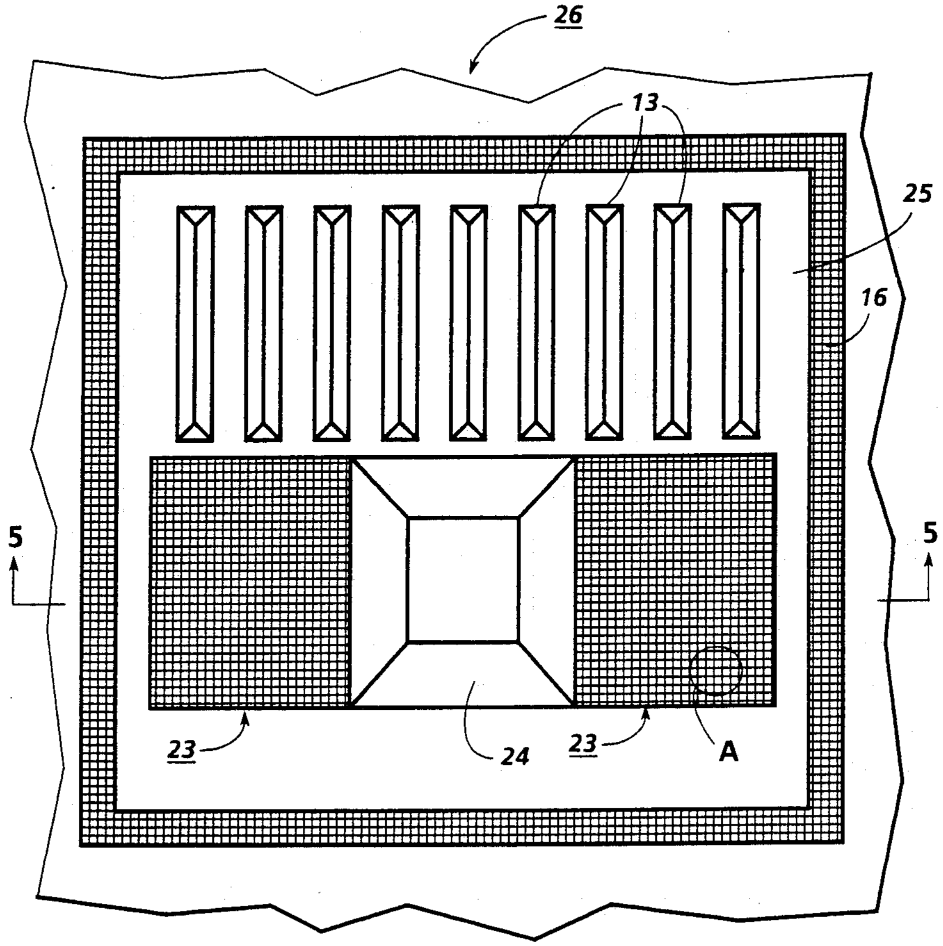
FIG. 3 is an enlarged, schematic plan view of an alternate embodiment of the channel plate shown in FIG. 1.

FIG. 3 is an enlarged, schematic plan view of an alternate embodiment of the channel plate 12 in FIG. 1. Instead of providing a segmented reservoir 14, a single, etched-through reservoir 24 is patterned with two dimensional patterns 23 of small rectangular vias 20 (see FIG. 4) arranged on opposite sides of reservoir 24 and adjacent one end of the parallel channel recesses 13. Only a few of the channel recesses are shown for clarity. Actually, there are about 200 having a spacing of 300 per inch. The portion of the two dimensional pattern 23 that is encircled by circle "A" is also shown in FIG. 4.

Figure 5:
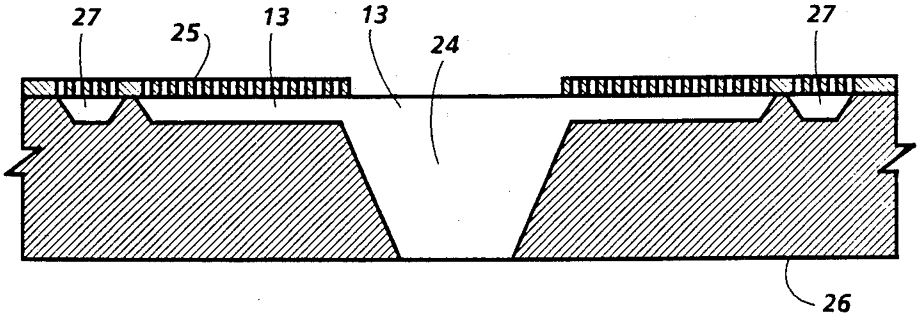
FIG. 5 is a cross sectional view of the channel plate of FIG. 3 as viewed along view line 5—5.
Figure 6:
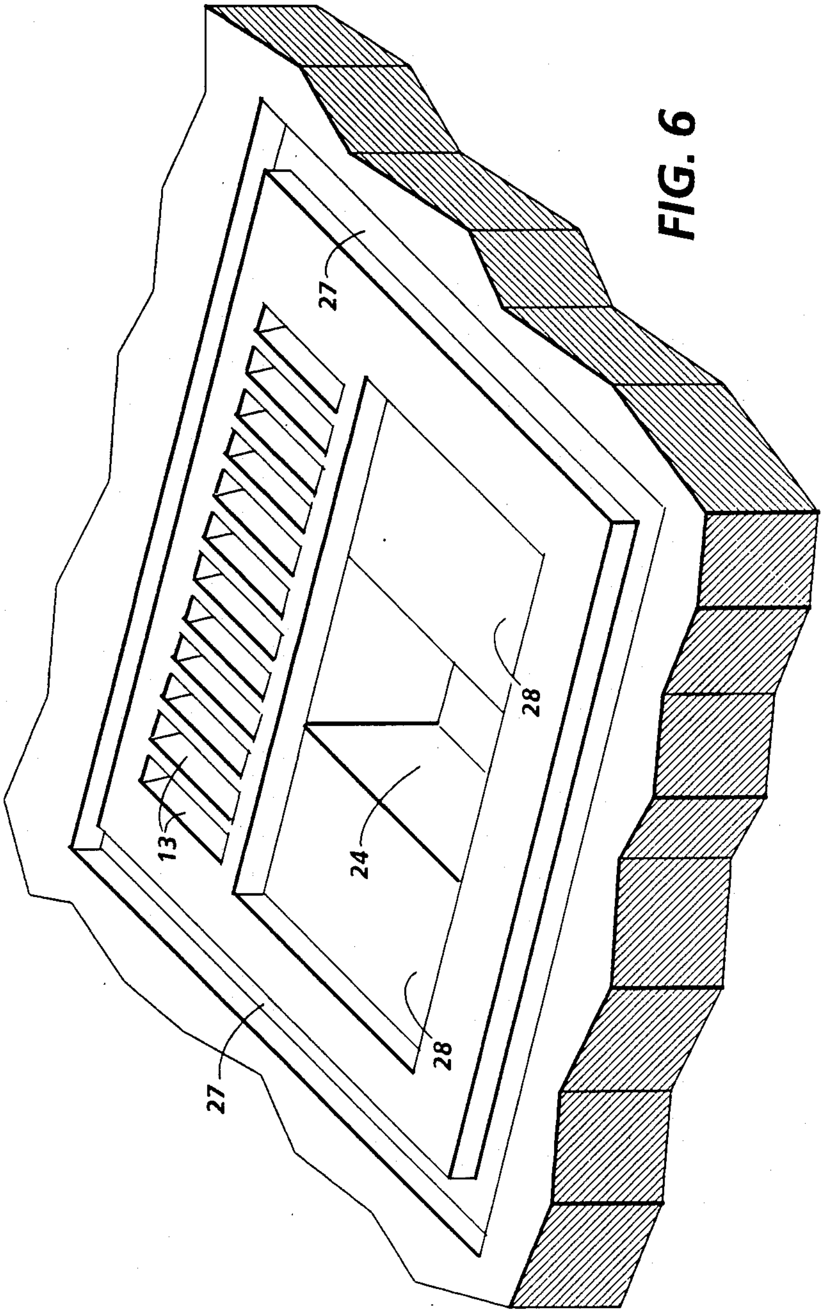
FIG. 6 is a schematic isometric view of the channel plate of FIG. 3 with the etch resistant mask removed.

FIG. 5 is a cross sectional view of the alternate channel plate 26 in FIG. 3 as viewed along view line 5—5 after the etching time period has been completed. The silicon walls (not shown) separating the recesses initially formed by vias 20 in grid patterns 16 and 23 have been etched away, because the spacing between vias 20 in the grids enabled complete undercutting in these patterned grid regions. This etching destruction of the walls in the patterned region 16 and 23 respectively produces recess 27 which encircles the reservoir and ink channels, and recesses 28 which are on opposite sides of the reservoir 24. These recesses 27 and 28 are stopped from etching deeper because of the delay in the etching until after the grid mask has been undercut and then the wafer 26 is removed from the etchant. Referring to FIG. 6, an isometric view of FIG. 3 is shown without the etch resistant mask 25. The small vias 20 in the patterned region or grid 16 form a shallow recess 27 which surrounds the ink reservoir 24, 28 and the ink channels 13. This shallow recess 27 provides clearance for the terminals (not shown) of the addressing electrodes on the heating element wafer (not shown). The shallow recesses 28 on each side of the through recess 24 open therein to provide ink flow paths from the through recess 24 throughout the shallow recesses 28.

As disclosed in U.S. Pat. No. 4,774,530 to Hawkins, the reservoir 24, 28 is placed into communication with the channels 13 by a patterned thick film insulative layer (not shown) that is sandwiched between the mated and bonded wafer 26 and a heating channel element wafer (not shown) having the heating element arrays. The mated and bonded wafers are then sectioned into individual printheads (not shown).

For most of the orientation dependent etching time period, the etch pattern is stably terminated. That is, the etching stops because of the intersection of the {111} planes. However, as discussed above, a terminating wall can be designed thin enough so that the normal mask pattern undercut results in complete undercut of the pattern towards the end of the etch period. Thus, orientation dependent etched structures in which a wall is completely undercut toward the end of the etch process combines the stability of terminated etch structures with the design freedom of non-terminated etch structure. To be successful, however, the undercut channel wafer must be removed from the etchant as soon as the through etches are completed to prevent unwanted destruction of the undercut walls or deeper recesses than desired.

To further clarify the concept of the plurality of small vias 20 in a grid pattern 16 of FIGS. 1 and 3, it is to be noted that under conventional orientation dependent etching design criteria, only etch rectangles or squares are allowed. Put another way, no obtuse etch angles are permitted. The grid pattern 16 which borders around the reservoir 14 and channel recesses 13 enables a violation of the conventional orientation dependent criteria, by using the undercutting etch technique described above. Namely, the small pattern wall between the rectangular vias 20 are designed to be less than twice the undercut dimension. For etching through a 20 mil thick silicon wafer, a 7 micrometer undercut is produced. If the wall is designed to be 13 micrometers wide, it is completely undercut at a later stage of the etch. In this case, a continuous etch trench 27 exists around the channel plate 12, as desired.

The undercutting is due simply to the lack of infinite anisotropy during the etching. That is, the terminating etch planes do have a finite etch rate and the time it takes to etch 500 micrometers in the (100) plane direction, the {111} planes etch 7 micrometers in the (111) plane direction. This mechanism is well understood and constant, so it can be compensated for during the design of the photomask. However, there is another mechanism which comes into play that is not constant. It is a result of photomask-crystal plane misalignment, and varies with the amount of the misalignment. The total amount of undercutting is then the summation of the undercut due to finite anisotropy and that due to the pattern-crystal plane misalignment.

Figure 7:
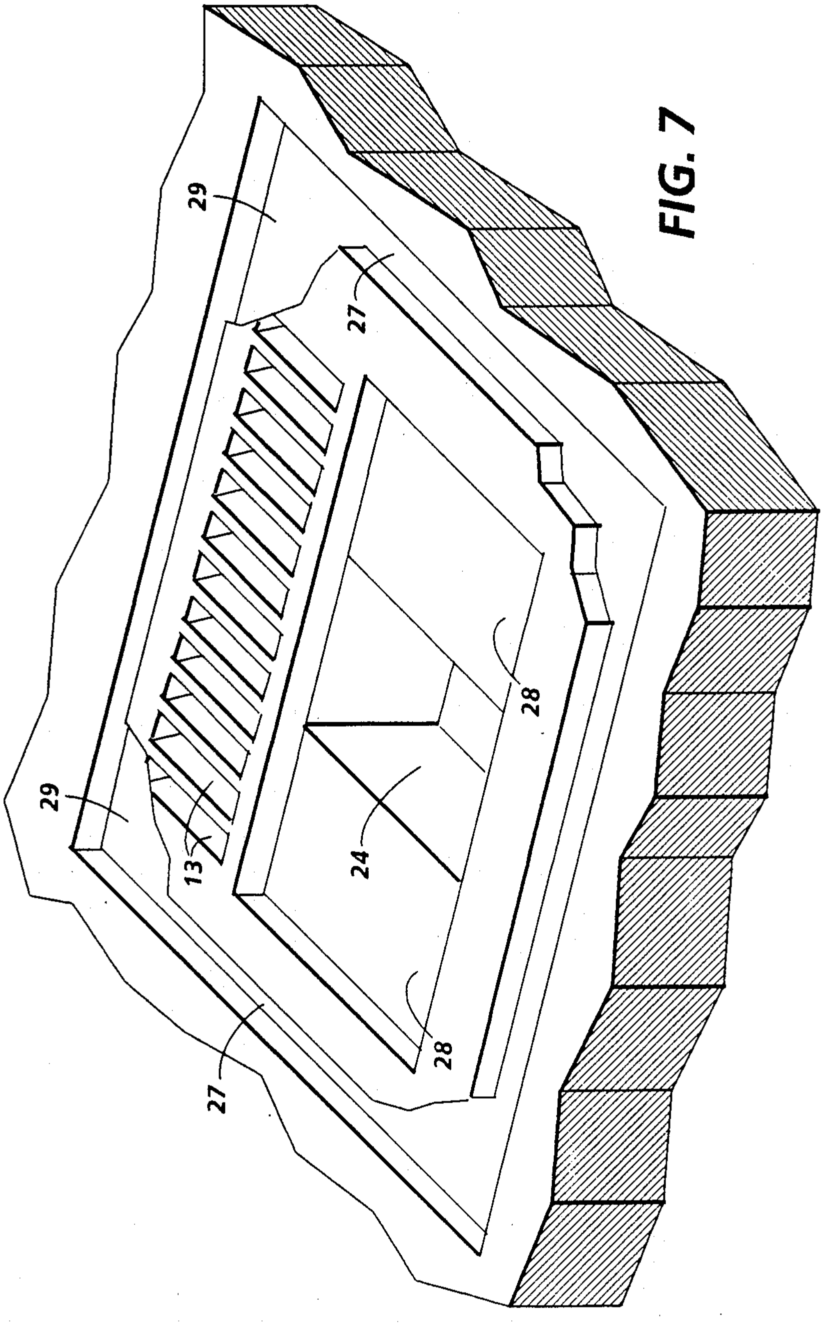
FIG. 7 is a schematic istometric view of the channel plate of FIG. 3 with the etch resistant mask removed to show the results early undercutting.

If the spacing between the small vias 20 of the grid pattern 16 and 23 is made 12 micrometers so that there will be complete undercutting, it is clear that this undercutting event will occur sooner or later during the anisotropic etching process. However, depending on the amount of pattern to crystal plane misalignment, the amount of undercutting may be too large and occur too early. A premature undercut breakthrough causes overetching which destroys critical components such as, for example, the channels 13 as shown in FIG. 7, where the interior corners of the terminal clearing recess 27 have been etched away leaving enlarged recesses 29 which include the outermost ink channels.

The grid pattern better shown in FIG. 4 eliminates the pattern undercut sensitivity, because it is composed of numerous relatively small squares that are small enough to cause the undercutting due to the pattern-crystal plane misalignment to be insignificant. The basic approach, of course, is to substitute a series of small self-destructing etch patterns for a single or even several larger etch patterns, thus minimizing impact of longer etching lengths and widths when misalignment with the wafer crystal plane occurs. For example, for a misalignment of $\theta$ degrees of the length "I" of a rectangular via, having width "w", the real etched width $W = w\cos\theta + I\sin\theta$. Therefore, if a via had a length of 6100 micrometers, the misalignment induced undercut would be 53 micrometers for a through etch when the misalignment $\theta$was only 0.5 degrees.

In contrast, if the grid pattern is composed, for example, of 12 micrometer squares separated by 12 micrometer spaces, the misalignment induced undercut would be only 0.1 micrometer for a misalignment $\theta$ of 0.5 degrees. Such a slight undercut caused by the misalignment of the pattern to the wafer crystal plane can be ignored as insignificant, providing an undercutting technique which is well controlled. Further, it should be noted that square shaped vias are not the only suitable pattern. Any equilateral polygon up to and including circles are satisfactory. However, many patterns are used in an etch grid pattern and the more sides a polygon has, the more flashes required to construct that particular pattern when making the photomask. This generic undercutting etch technique can be applied to a number of etch designs involving non-rectangular shapes or variable etch depths such as illustrated in FIG. 6.

In summary, a method of maximizing orientation dependent etching dimensional control is accomplished by minimizing the pattern undercut caused by the pattern-wafer crystal plane misalignment factor. This is done by using a mosaic or grid pattern of relatively small vias to eliminate or make insignificant the misalignment induced undercut. The walls between the small etch grid patterns are made small so that towards the end of the etch time period, they all undercut due to the finite anisotropy of the orientation dependent etching process and a continuous pattern finally results.

In another embodiment, not shown, the widths of the masked lines (i.e. spaces between vias) are selected to undercut after varying predetermined time periods of etching. Once the masking layer has undercut, a zig-zag pattern created in the silicon quickly etches until a relatively slow etching {100} plane is formed. The {100} plane is then etched in a controlled manner. If gradient line widths of 14 micrometers or less are used, a ramp or staircase structure is made.

Many modifications and variations are apparent from the foregoing description of the invention, and all such modifications and variations are intended to be within the scope of the present invention.

We claim:

1. An improved method of fabricating a thermal ink jet printhead of the type produced by the mating of an anisotropically etched silicon substrate containing ink flow directing recesses with a substrate having heating elements and addressing electrodes, so that selective application of electrical pulses to the heating elements expel ink droplets from the printhead, wherein the improved method comprises the steps of:

(a) patterning an etch resistant material on one surface of a (100) silicon substrate to form at least two sets of vias therein having predetermined sizes, shapes, and predetermined spacing therebetween, said predetermined spacing permitting selected complete undercutting by an anisotropic etchant within a predetermined etching time period; and (b) anisotropically etching the patterned silicon substrate with the patterned etch resistant material for said predetermined time period to form at least two sets of separate recesses, each recess being separated from each other by a wall, the surfaces of said walls being {111} crystal planes of the silicon substrate, whereby certain predetermined separately etched recesses in one of said sets are selectively placed into communication with each other by the selective undercutting of their common wall, while the reminder of the undercut walls provide strengthening reinforcement to the printhead, so that larger printheads may be fabricated which are more robust without relinquishing resolution or reducing tolerances.

2. A method of fabricating a thermal ink jet printhead of the type produced by the mating two substrates, one being silicon which is anisotropically etched to form ink flow directing recesses and the other having means for thermally expelling ink droplets, comprising the steps of:

(a) depositing a layer of etch resistant material on the surfaces of a (100) silicon substrate;

(b) patterning the etch resistant material on one surface of the silicon substrate to form a mask having a plurality of first vias therein with predetermined spacing therebetween and a plurality of equally spaced and equally dimensioned, parallel, elongated second vias, one end of the elongated second vias being perpendicular to and adjacent the first vias and being a predetermined distance therefrom;

(c) anisotropically etching the patterned silicon substrate for a predetermined period of time to form recesses therein, the recesses having walls which lie in the {111} crystal planes of the silicon substrate, the first vias being dimensioned for etching through the silicon substrate and the second vias being dimensioned for forming elongated V-grooves, the predetermined spacing between the first vias providing for complete undercutting therebetween by said normal anisotropic etching at the end of the etching time period, so that relatively small passageways are formed by the undercutting at interface of the mask and silicon substrate, the passageways providing communication between adjacent recesses formed by the first vias, whereby the remaining portions of the walls between the recesses formed by the first vias act as strengthening ribs produced by the predetermined spacings between the first vias of the mask and thus provide a stronger, less fragile silicon substrate;

(d) forming an equally spaced, linear array of resistive material on a surface of a second substrate for use as heating elements, and forming a pattern of electrodes on the same second substrate surface for enabling individual addressing of each heating element with electrical pulses representative of digitized data;

(e) aligning and bonding the etched silicon substrate and second substrate together to fixedly mate their respective surfaces having the recesses and heating elements in order to form an ink jet printhead, said printhead having ink channels, each having a heating element therein at predetermined location, a supply reservoir having an ink inlet and having strengthening ribs therein, so that the plurality of combination inlet and reservoirs function as a single inlet and reservoir;

(f) placing the ink channels into communication with the reservoir; and (g) dicing one edge of the aligned and bonded substrates in a direction perpendicular to the ink channels, so that the ends of the ink channels opposite the ones in communication with the reservoir are opened to serve as droplet emitting nozzles.

3. The method of claim 2, wherein step (b) further comprises patterning the etch resistant material on said one surface with regions of small vias that are spaced predetermined distances apart, so that during step (c) the small vias are undercut to form relatively shallow recesses throughout the regions.

4. The method of claim 3, wherein the predetermined distances between small vias in the regions are uniform, so that the shallow recesses have equal depths; and wherein the spacing between the first vias is equal and parallel to each other, so that the strengthening ribs formed in step (c) are substantially equal.

5. The method of claim 3, wherein the predetermined distances between the small vias in the regions are dimensioned so that some undercut earlier during the etching period and thus are etched deeper to form stairs and ramps in these regions.

6. An improved method of fabricating large array thermal ink jet printheads of the type produced by the mating, bonding, and dicing of a first anisotropically etched silicon wafer containing a plurality of sets of ink flow directing recesses with a second wafer having a plurality of sets of heating elements and addressing electrodes, wherein the improved method comprises the steps of:

forming a pattern of sets of vias in an etch resistant material covering a single crystal silicon wafer, the vias of each set having predetermined spacing; and anisotropically etching the patterned wafer for a predetermined time period, so that predetermined adjacent etched recesses are allowed to undercut near the end of the etching time period to such an extent that they are joined, thus allowing greater flexibility in selection of anisotropically etched recess shapes while concurrently providing means for strengthening the etched silicon wafer during fabrication and reducing the effects of misalignment between the patterned vias and the crystal planes of the silicon wafer.

7. The improved method of claim 6, wherein each set of patterned vias includes one or more grid patterns of relatively small vias which have a predetermined spacing, so that near the end of the anisotropic etching time period the grid of vias are undercut and the grid of etched recesses formed become joined to create a single relatively flat bottomed recess having a bottom with a {100} crystal plane orientation.

8. The improved method of claim 7, wherein the grid pattern has adjacent vias with predetermined periodically varying separations such that the vias in the grid pattern are undercut at varying times with a resultant single recess being produced having a terraced bottom in which each terraced bottom portion is a {100} crystal plane.

9. The improved method of claim 7, wherein each set of patterned vias include two or more areas of grid patterns of relatively small vias, each area of grid patterns having equally spaced vias designed to undercut after a different length of anisotropically etching time period, so that each area of grid pattern forms recesses which have different depths.

* * * * *